(12) United States Patent
Lindberg et al.

(10) Patent No.: US 6,634,014 B1
(45) Date of Patent: Oct. 14, 2003

(54) DELAY/LOAD ESTIMATION FOR USE IN INTEGRATED CIRCUIT DESIGN

(75) Inventors: Grant Lindberg, Pleasanton, CA (US); Stefan Graef, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 163 days.

(21) Appl. No.: 09/735,255

(22) Filed: Dec. 12, 2000

(51) Int. Cl.[7] .............................. G06F 17/50; G06F 9/45
(52) U.S. Cl. ...................... 716/6; 716/1; 716/8; 716/9; 716/10; 716/13; 716/18
(58) Field of Search ............................ 716/1–21; 703/14

(56) References Cited

U.S. PATENT DOCUMENTS 5,544,071 A * 8/1996 Keren et al. .................... 716/6
6,145,117 A * 11/2000 Eng .............................. 716/18
6,216,252 B1 * 4/2001 Dangelo et al. ................ 716/1

* cited by examiner

Primary Examiner—Vuthe Siek
Assistant Examiner—Helen Rossosuek
(74) Attorney, Agent, or Firm—Mitchell, Silberberg, & Knupp, LLP

(57) ABSTRACT

Delay and/or load estimation is performed prior to physical layout in an integrated circuit (IC) design process. Initially, a description of the IC design is obtained, the description being in a hardware description language (HDL). Floor planning is then performed based on the HDL description, and buffers are inserted into the IC design based on such floor planning. Finally, delays and/or loads are estimated in the IC design while taking into account the effect of the buffers. The buffers are inserted in the foregoing processing based on anticipated processing later in the IC design process.

20 Claims, 2 Drawing Sheets

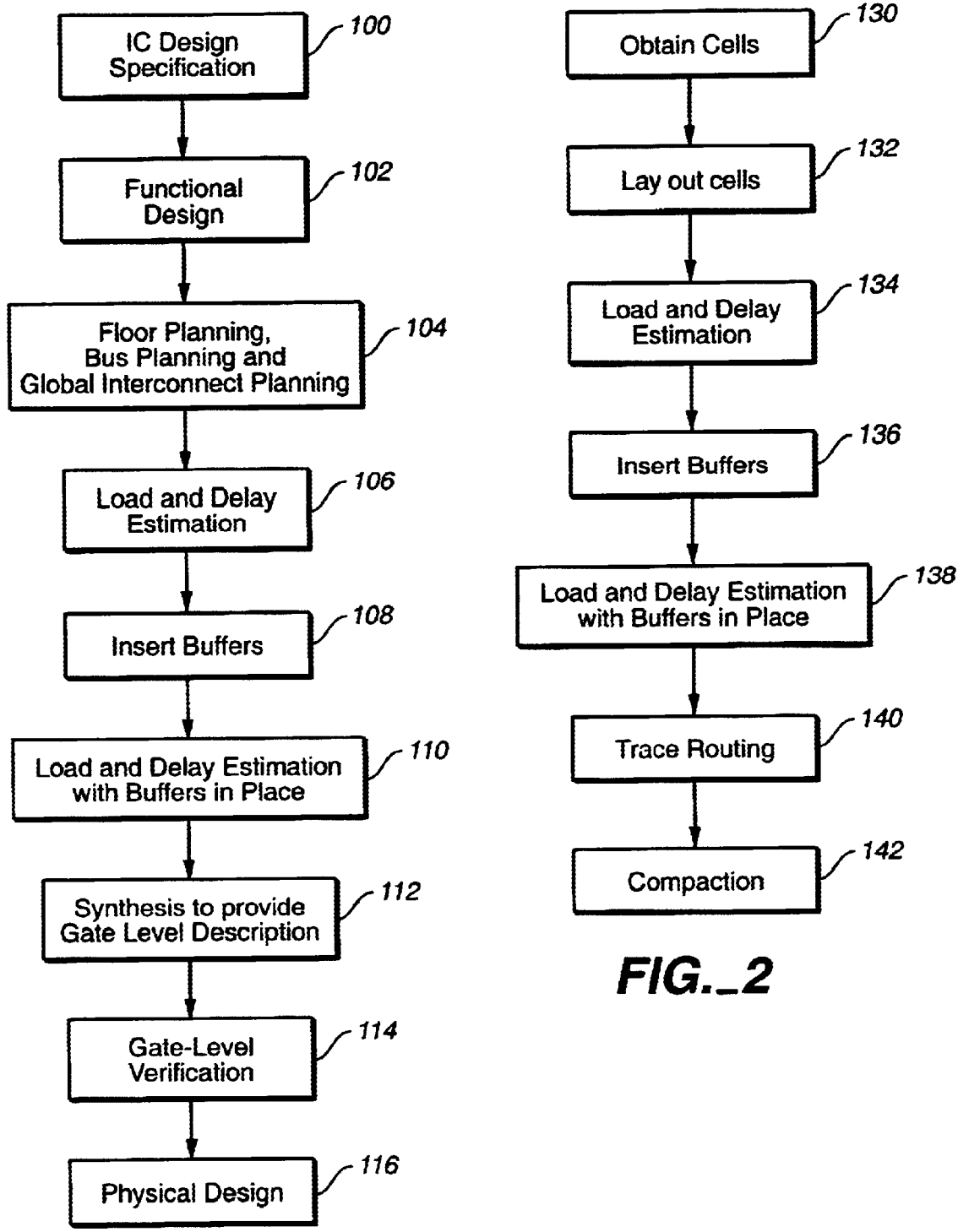

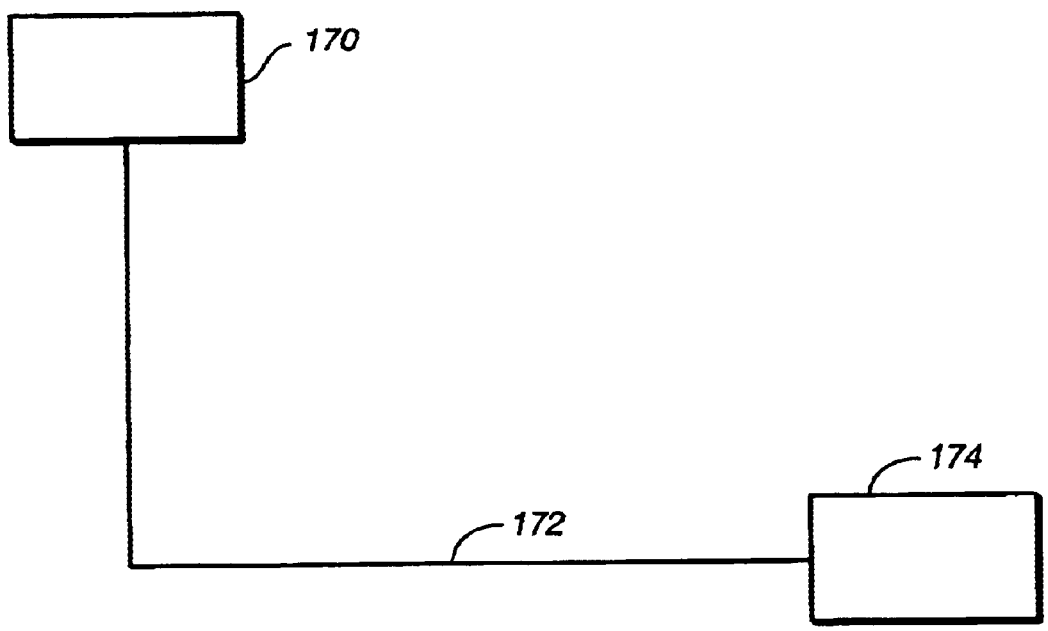
FIG._3A
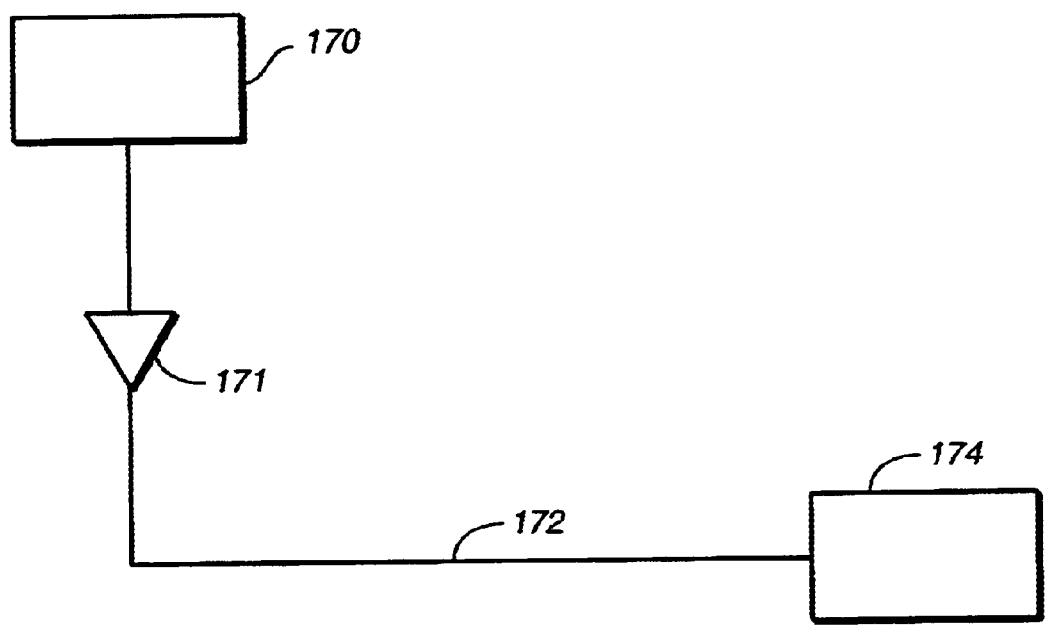
FIG._3B

DELAY/LOAD ESTIMATION FOR USE IN INTEGRATED CIRCUIT DESIGN

BACKGROUND OF THE INVENTION

1. Field of the Invention

The present invention concerns estimation of delays and electrical loads during integrated circuit (IC) design, particularly during the early phases of IC design.

2. Description of the Prior Art

Integrated circuit design typically includes the following steps performed in the following order: (i) designing the circuit in a hardware description language (HDL), often including register transfer level (RTL) descriptions; (ii) RTL floor planning, bus planning and global interconnect planning; (iii) delay and load estimation; and then (iv) synthesis of the HDL to provide a netlist description of the circuit. In conventional integrated circuit design, delay and load estimation in step (iii) often are performed by simply considering the number and type of receiving elements for a particular driving element, estimating wire length required for interconnections, and using expected technology-dependent values for the capacitances-per-unit-length and resistances-per-unit-length for such interconnections.

The present inventors have discovered, however, that this conventional technique for estimating delay and load prior to synthesis often is insufficiently accurate, frequently leading to inappropriate design choices early on in the design process.

SUMMARY OF THE INVENTION

The present invention addresses this problem by providing a technique in which delays and/or loads are estimated in an IC design, based on HDL floor planning, but by first inserting buffers into the IC design in anticipation of processing to be performed later in the IC design process.

Thus, in one aspect the invention is directed to performing delay estimation prior to physical layout in an integrated circuit (IC) design process. Initially, a description of the IC design is obtained, the description being in a hardware description language (HDL). Floor planning is then performed based on the HDL description, and buffers are inserted into the IC design based on such floor planning. Finally, delays are estimated in the IC design while taking into account the effect of the inserted buffers. It is a feature of this aspect of the invention that the buffers are inserted in the foregoing processing based on anticipated processing later in the IC design process.

In another aspect, the invention is directed to performing load estimation prior to physical layout in an integrated circuit (IC) design process. Initially, a description of the IC design is obtained, the description being in a hardware description language (HDL). Floor planning is then performed based on the HDL description, and buffers are inserted into the IC design based on such floor planning. Finally, loads are estimated in the IC design while taking into account the effect of the inserted buffers. It is a feature of this aspect of the invention that the buffers are inserted in-the foregoing processing based on anticipated processing later in the IC design process.

By inserting buffers into an IC description, prior to performing load or delay estimation in the foregoing manners and in anticipation of processing later in the IC design process, the present invention often can provide more accurate delay and/or load estimates than conventional techniques would permit. As a result, more appropriate design choices often can be made (such as during the synthesis phase), thereby frequently reducing the number of subsequent design problems and shortening the overall design process.

In a more particular aspect of the invention, the buffers are inserted according to rules that are similar to predetermined rules used in inserting buffers later on in the design process based on physical layout. As a result, a better estimate of what the final loads and/or delays will be often can be obtained early on in the design process.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 is a simplified flow diagram for explaining integrated circuit design according to a representative embodiment of the invention.

FIG. 2 is a simplified flow diagram for explaining physical design according to a representative embodiment of the invention.

FIGS. 3A and 3B illustrate an example of the buffer insertion method according to a representative embodiment of the invention.

DESCRIPTION OF THE PREFERRED EMBODIMENT(S)

As indicated above, the present invention concerns estimation of loads and delays in IC design. In this regard, references herein to "delay" are intended to include ramptime, as well as propagation delay. In fact, the greatest portion of the improvement in delay estimation achieved by the present invention generally arises from more accurate ramptime calculation.

Integrated Circuit Design.

FIG. 1 illustrates a flow diagram for providing a brief overview of IC chip design according to a representative embodiment of the invention. Briefly, according to FIG. 1, an IC design specification is prepared; a functional description of a system corresponding to the design specification is produced; floor planning, bus planning and global interconnect planning are performed; load and delay estimation are performed; buffers are inserted into the design; load and delay estimation are performed with the buffers in place; a gate-level circuit description is synthesized from the functional description; a simulation is performed to verify the feasibility of the gate-level description; and physical design is performed.

In more detail, in step 100 an IC design specification is prepared. At this initial step of the design process, the desired system design is described in the highest level of abstraction. Subsequent steps in the design process provide successively more detail until all information required to fabricate the chip has been derived. Preferably, the design specification dictates features such as performance criteria, required external interfaces and protocols, and product cost targets. Ordinarily, this step is performed manually.

In step 102, a functional design is produced. The functional design describes a system that will satisfy the IC design specification prepared in step 100. Preferably, the functional design is written using a highly structured syntax so as to permit subsequent steps in the design process to be performed using automated computer-aided design tools. More preferably, the functional design is written in a hardware description language (HDL) such as VHDL (IEEE standard 1076–1993) or Verilog-HDL. Typically, HDL can describe a design in various levels of abstraction, such as boolean level or register transfer level (RTL). Preferably, the HDL is written in RTL. Ordinarily, generation of the HDL code is performed manually, although certain automated tools may be used to facilitate the task.

In step 104, floor planning, bus planning and global interconnect planning are performed based on the HDL. In particular, floor planning in this step typically involves mapping out areas on the surface of the IC where high-level functionality defined by the HDL will be located. Bus planning and global interconnect planning are concerned with high-level descriptions of where wires will be routed on the IC. Various conventional techniques may be used in this step and, accordingly, no particular technique is discussed here in detail.

In step 106 load and delay estimations are performed based at least in part on the results of the processing performed in step 104. In particular, based on the general areas identified for the various functional modules and global interconnect planning, approximate wire lengths for various interconnections can be determined. When combined with the known resistance and capacitance properties of interconnections for the technology to be used for implementing the IC and the input impedances for the various receiving elements (i.e., those elements driven by the driving elements), it is typically a relatively straightforward matter to calculate load and delay values. It is noted that this step is substantially similar or identical to conventional load and delay estimation.

A primary purpose of this step 106 is to provide information that will be useful in identifying critical paths where buffers should be inserted in step 108 below. Thus, it is preferable that the methods for calculating loads and delays in this step 106 be matched as closely as possible to the methods used in step 134 (discussed below in connection with FIG. 2). Alternatively, if buffer insertion in step 136 (also discussed below in connection with FIG. 2) is based on criteria other than estimated loads and/or delays, such as wire length, this step may be omitted entirely.

In step 108, buffers are inserted into the IC design. The primary purpose of this step is to anticipate processing that will occur later in the design process and to insert buffers in an attempt to assure that the load and delay estimation of step 110 (discussed below) provides information that is as close as possible to the load and delay values that will result after such later processing. In the preferred embodiment of the invention, the later processing that is anticipated in this step 108 is insertion of buffers into the IC design. More preferably, such later buffer insertion occurs after component layout. As a result, the step of inserting buffers in this step 108, both as to location and characteristics (e.g., drive strength and delay) of the buffers inserted, preferably is performed according to rules that are similar to the rules used to insert buffers in step 136 (discussed below in connection with FIG. 2). More preferably, the rules used in this step 108 are as similar as possible to the rules used in step 136, although generally the two sets of rules cannot be exactly identical due to the differences in the information that is available during the two steps.

In one embodiment of the invention, buffers are inserted according to predetermined rules based on the load and delay information obtained in step 106. For instance, a buffer may be inserted in any path where a delay exceeds a given threshold, where a sum of delays exceeds a threshold, where a load exceeds a threshold, or based upon any other criteria. In each instance, the threshold may be fixed in advance, set based upon one or more characteristics of the driving cell, or set based upon any other characteristics of the circuit.

In step 110, load and delay information are estimated for the circuit with the buffers inserted in step 108 in place. Techniques for such load and delay estimation are well-known in the art and are not discussed in detail here.

In step 112, a description of a gate-level circuit is synthesized based on the HDL code produced in step 102. Preferably, gate-level design is performed by running an automated synthesis tool on the HDL code. Upon execution of the synthesis tool, physically realizable gates and flip-flops are selected from a predefined library and are interconnected in a manner so as to satisfy the relationships and to perform the processing-defined by the HDL code. Processing by the synthesis tool preferably utilizes pre-defined user design constraints which have been formulated in an effort to enhance the feasibility of the design, particularly with respect to problems which might otherwise not be discovered until later in the design process. The format of the gate-level circuit description synthesized in this step 112 preferably is a "netlist", which lists circuit components (such as gates and/or flip-flops) and "nets", with each net consisting of a set of pins belonging to such circuit components that are to be connected together.

Preferably, the IC design synthesized in this step 112 excludes the buffers inserted in step 108. However, the load and/or delay information obtained in step 110 preferably is used in the synthesis process to make more appropriate design choices. In this regard, the load and/or delay information provided by step 110 typically can be used directly in place of the conventional load and delay information which in conventional design techniques: would have been provided to he synthesis tool. For this reason, when implementing the present invention it is generally unnecessary to modify the conventional synthesis tool at all.

In gate-level verification step 114, a computer simulation is run to test the circuit design synthesized during gate-level design step 112. The goals of this simulation are to determine whether all performance criteria have been met and whether any timing or other circuit errors will occur in response to a variety of different input signals and conditions. Techniques for performing gate-level verification are well-known in the art and are not discussed in detail here. Upon completion of gate-level verification in this step 114, the netlist is provided to physical design step 116, and a dump of top-level signals in the netlist is provided to the user.

In physical design step 116, the netlist generated in step 112 is mapped to information for physically implementing the corresponding circuit on an IC die.

The objective of physical design is to determine an optimal arrangement of devices in a plane or in a three-dimensional space, and an efficient interconnection or routing plan between the devices to obtain the desired functionality. One goal of physical design step 116 is to implement the design using minimum chip area. Other factors considered during physical design include timing considerations, thermal generation, power/ground noise, electromagnetic effects, and the number of metal layers available for wire routing.

Step 116 produces a set of design files in an unambiguous representation known as an intermediate form that describes the layout. The design files are then converted into pattern generator files that are used to produce patterns called masks by an optical or electron beam pattern generator. A representative embodiment of physical design step 116 is discussed in more detail below in connection with FIG. 2.

It should be noted that while one example of an IC design process is described above, variations on the foregoing process may also be used, as will be apparent to those skilled in the art. In addition, although the foregoing design process is described above and shown in FIG. 1 as being purely sequential, many times one or more of the steps will need to be repeated. For example, if the design is found to be infeasible at one step, one or more earlier steps might need to be re-executed in order to correct the problem. For example, it might occur that in step 112 a gate-level description cannot be generated to satisfy the functional design requirements using the available technology library, while at the same time maintaining the user's design constraints. In this case, the functional description may need to be redesigned in step 102 in order to achieve a feasible design.

Physical Design.

A more detailed discussion of physical design step 116 (shown in FIG. 1) in the preferred embodiment of the invention will now be discussed with reference to the flow diagram shown in FIG. 2. Briefly, according to FIG. 2, cells are obtained based on the supplied netlist; cells are laid out on the surface of the IC; load and delay estimation are performed; buffers are inserted; load and delay information is performed again with the buffers inserted; traces are routed between the cells; and compaction is performed.

In more detail, in step 130 cell descriptions are obtained from a cell library based on the netlist input from step 106. Specifically, physical descriptions of logic and other signal processing cells, as well as I/O buffer cells, are obtained corresponding to the circuits identified in the netlist.

In step 132, the logic and other cells are placed on the surface of the IC die. As used herein, "layout" or "placement" refers to generating layout or placement information. During device fabrication, electronic devices and wires are formed on the IC die using the placement information generated during physical design.

A main concern in performing placement is to reduce spacing between cells, thereby minimizing the amount of wire routing that will need to be performed. The main sub-steps in performing this step 132 are partitioning, floor planning and layout.

The logic portion of a chip may contain several million transistors. As a result, layout of the entire chip generally cannot be handled due to the limitations of available memory space and computation power. Therefore, the logic circuitry normally is partitioned by grouping circuit components into blocks, such as subcircuits and modules. The actual partitioning process considers many factors such as the size of the blocks, number of blocks and number of interconnections between the blocks.

The output of partitioning is a set of blocks, together with the interconnections required between these blocks. In large circuits, the partitioning process is often hierarchical, although non-hierarchical (e.g. flat) processes can be used, and at the topmost level a circuit can have between 5 to 25 blocks. However, greater numbers of blocks are possible. Each block is then partitioned recursively into smaller blocks.

Floor planning and placement are concerned with selecting good layout alternatives for each block of the entire chip, as well as between blocks and to the edges. Floor planning is a critical step as it sets up the groundwork for a good layout. During placement, the blocks are exactly positioned on the chip. One goal of placement is to find a minimum area arrangement for the blocks that allows completion of interconnections between the blocks. Placement typically is done in two phases. In the first phase, an initial placement is created. In the second phase, the initial placement is evaluated and iterative improvements are made until the layout has minimum area and conforms to design specifications.

In step 134, load and delay estimation are performed based on the physical layout performed in step 132. Techniques for performing this step are well-known in the art and are therefore not discussed in detail here. A main goal in performing this step is to identify necessary interconnections which may exceed timing or load requirements of the circuit. As a result, it is possible to omit this step and to simply identify such interconnections based, for example, on interconnection length, interconnection impedances per unit length, and cell characteristics alone.

In step 136, buffers are inserted into the IC design (e.g., into the netlist) and, correspondingly, into the placement created in step 132 in an attempt to overcome potential load or delay problems. Thus, an initial sub-step is to identify those interconnections that may pose problems. For this purpose, the results of step 134 may be used to find loads or delays that are near, at or above the circuit requirements. Alternatively, it is possible to identify potential problems without first directly calculating load or delay, such as by utilizing rules that set thresholds on how long an interconnection may be in each of various different situations. In any event, such rules preferably are predetermined based on technology-dependent considerations. Various techniques for performing buffer insertion in this step are well-known in the art and are therefore not discussed in significant detail here.

In step 138, load and delay estimation are performed with the buffers, inserted in step 136, in place. Various techniques for performing this step are well-known in the art and are therefore not discussed in significant detail here. In the event that any requirements still are not satisfied, one or more of the preceding steps, as well as this step 138, may need to be repeated. Once all requirements have been satisfied, the remainder of the physical design phase is completed with the buffers inserted in step 136 included in the design.

In step 140, traces are routed from the I/O cells and interior logic cells to other I/O and interior logic cells, as well as to power and ground rings. The objective of routing is to complete all the interconnections between cells and within each cell according to the specified netlist, subject to the space available for routing. Another goal of routing is to complete all circuit connections using the shortest possible wire length.

In step 138, compaction is performed. Compaction is the process of compressing the layout in both directions (x and y) such that the total area is reduced. By making the chips smaller, wire lengths are reduced, which in turn reduces the signal delay between components of the circuit. At the same time, a smaller area enables more chips to be produced on a wafer, which in turn reduces the cost of manufacturing. Compaction must ensure that no rules regarding the design and fabrication processes are violated.

While the foregoing implementation of physical design step 116 is preferable, other variations apparent to those skilled in the art may also be used. Moreover, although the steps are described above and shown in FIG. 2 as being entirely sequential, it should be understood that feasibility problems discovered in any one of the steps frequently will require repeating a prior step. For example, routing problems discovered in step 140 might require adjustments to layout by re-executing portions of step 132.

FIGS. 3A and 3B illustrate an example of the buffer insertion method of step 108 described above. Upon completion of step 104, at least rough positions for cells 170 and 174, as well as at least a rough interconnection path 172 between those two cells, will have been identified. Assuming that cell 170 is the driving cell, the load seen by cell 170 is the input impedance of receiving cell 174 and the impedance of path 172. Based on these impedances, the driving strength and possibly other characteristics of cell 170 (e.g., cell delay), and possibly other circuit characteristics (e.g., timing considerations pertaining to other connected cells), a determination may be made in step 108 to insert a specific buffer 171 where indicated in FIG. 3B. Attentively, the decision may be made without directly calculating loads or delays, and instead based on the path length 172 and other considerations, as discussed above.

In either event, the insertion rules preferably are similar to, or as identical as possible to, the insertion rules used in step 136. Thus, assuming the same information were provided to step 136, step 136 preferably also would insert the same buffer 171 at the same position shown in FIG. 3B. Thus, when load and/or delay estimation are performed in step 110 the values obtained typically will be closer to the values that will be obtained in step 138.

System Environment.

The methods and techniques described herein can be practiced with a general-purpose computer system. Such a computer typically will include, for example, at least some of the following components: one or more central processing units (CPUs), read-only memory (ROM), random access memory (RAM), input/output circuitry for interfacing with other devices and for connecting to one or more networks, a display (such as a cathode ray tube or liquid crystal display), other output devices (such as a speaker or printer), one or more input devices (such as a mouse or other pointing device, keyboard, microphone or scanner), a mass storage unit (such as a hard disk drive), a real-time clock, a removable storage read/write device (such as for reading from and/or writing to a magnetic disk, a magnetic tape, an opto-magnetic disk, an optical disk, or the like), and a modem. In operation, the process steps to implement the above methods typically are initially stored in mass storage (e.g., the hard disk), are downloaded into RAM and then executed by the CPU out of RAM.

Suitable computers for use in implementing the present invention may be obtained from various vendors. Various types of computers, however, may be used depending upon the size and complexity of the tasks. Suitable computers include mainframe computers, multiprocessor computers, workstations, personal computers, and even smaller computers such as personal digital assistants (PDAs), wireless telephones or any other networked appliance or device. In addition, although a general-purpose computer system has been described above, a special-purpose computer may also be used. In particular, any of the functionality described above can be implemented in software, hardware, firmware or any combination of these, with the particular implementation being selected based on known engineering tradeoffs.

It should be understood that the present invention also relates to machin-ereadable media on which are stored program instructions for performing the methods of this invention. Such media include, by way of example, magnetic disks, magnetic tape, optically readable media such as compact disc (CD) ROMs and DVD ROMs, semiconductor memory such as PCMCIA cards, etc. In each case, the medium may take the form of a portable item such as a small disk, diskette, cassette, etc., or it may take the form of a relatively larger or immobile item such as a hard disk drive, ROM or RAM provided. in a computer.

Conclusion.

As indicated above, a significant feature of the present invention is the insertion of buffers into the IC design for the purpose of performing load and/or delay estimation early on in the design process, e.g., prior to synthesis.

Specifically, such buffers are inserted based on anticipated processing later in the IC design process. As a result, more accurate load and/or delay information can be obtained early in the design process. In the preferred embodiment of the invention, the buffers are inserted based on anticipated buffer insertion during or subsequent to cell placement. Accordingly, the buffer insertion rules for the two steps preferably are similar and, more preferably, are as similar as possible.

However, the buffer insertion prior to synthesis may instead be based on anticipated buffer insertion at any other subsequent point in the design process. In fact, such buffer insertion may be based on any subsequent processing in the design process.

Thus, although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Rather, it is intended that all such variations not departing from the spirit of the invention be considered as within the scope thereof as limited solely by the claims appended hereto.

Also, several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood those skilled in the art.

What is claimed is:

1. A method for performing delay estimation prior to physical layout in an integrated circuit (IC) design process, said method comprising:

(a) obtaining a description of the IC design in a hardware description language (HDL);

(b) performing floor planning based on the HDL description;

(c) inserting buffers into the IC design based on said floor planning; and (d) estimating delays in the IC design while taking into account effects of the buffers, wherein the buffers are inserted in step (c) based on anticipated processing later in the IC design process.

2. A method according to claim 1, wherein the HDL description comprises a register transfer level (RTL) description.

3. A method according to claim 1, wherein step (b) also includes bus planning and global interconnect planning.

4. A method according to claim 3, further comprising a step (b') of estimating delays in the IC design based on said floor planning, bus planning and global interconnect planning, and wherein the buffers are inserted in step (c) based on the delays estimated in said step (b').

5. A method according to claim 1, further comprising:
   (e) synthesizing the HDL description, without the buffers inserted in step (c) included, to obtain a circuit netlist.

6. A method according to claim 5, further comprising steps of:
   (e) performing physical layout based on the circuit netlist; and
   (f) inserting buffers into the IC design according to predetermined rules based on said physical layout,
      wherein inserting buffers in said step (c) is performed according to rules that are similar to the predetermined rules used in step (f).

7. A method according to claim 1, further comprising a step (b') of estimating delays in the IC design based on said floor planning, and wherein the buffers are inserted in step (c) based on the delays estimated in said step (b').

8. A method according to claim 1, further comprising a synthesis step of synthesizing the HDL description to produce a structural description of the IC design, wherein said step (c) is performed prior to said synthesis step.

9. A method for performing load estimation prior to physical layout in an integrated circuit (IC) design process, said method comprising:
   (a) obtaining a description of the IC design in a hardware description language (HDL);
   (b) performing floor planning based on the HDL description;
   (c) inserting buffers into the IC design based on said floor planning; and
   (d) estimating loads in the IC design while taking into account effects of the buffers,
      wherein the buffers are inserted in step (c) based on anticipated processing later in the IC design process.

10. A method according to claim 9, wherein the HDL description comprises a register transfer level (RTL) description.

11. A method according to claim 9, wherein step (b) also includes bus planning and global interconnect planning.

12. A method according to claim 11, further comprising a step (b') of estimating loads in the IC design based on said floor planning, bus planning and global interconnect planning, and wherein the buffers are inserted in step (c) based on the loads estimated in said step (b').

13. A method according to claim 9, further comprising:
   (e) synthesizing the HDL description, without the buffers inserted in step (c) included, to obtain a circuit netlist.

14. A method according to claim 13, further comprising steps of:
   (e) performing physical layout based on the circuit netlist; and
   (f) inserting buffers according to predetermined rules based on said physical layout,
      wherein inserting buffers into the IC design in said step (c) is performed according to rules that are similar to the predetermined rules used in step (f).

15. A method according to claim 9, further comprising a step (b') of estimating loads in the IC design based on said floor planning, and wherein the buffers are inserted in step (c) based on the loads estimated in said step (b').

16. A method according to claim 9, further comprising a synthesis step of synthesizing the HDL description to produce a structural description of the IC design, wherein said step (c) is performed prior to said synthesis step.

17. A computer-readable medium storing computer-executable process steps for performing delay estimation prior to physical layout in an integrated circuit (IC) design process, said process steps comprising steps to:
   (a) obtain a description of the IC design in a hardware description language (HDL);
   (b) perform floor planning based on the HDL description;
   (c) insert buffers into the IC design based on said floor planning; and
   (d) estimate delays in the IC design while taking into account effects of the buffers,
      wherein the buffers are inserted in step (c) based on anticipated processing later in the IC design process.

18. An apparatus for performing delay estimation prior to physical layout in an integrated circuit (IC) design process, said apparatus comprising:
   (a) means for obtaining a description of the IC design in a hardware description language (HDL);
   (b) means for performing floor planning based on the HDL description;
   (c) means for inserting buffers into the IC design based on said floor planning; and
   (d) means for estimating delays in the IC design while taking into account effects of the buffers,
      wherein the buffers are inserted in step (c) based on anticipated processing later in the IC design process.

19. A computer-readable medium storing computer-executable process steps for performing load estimation prior to physical layout in an integrated circuit (IC) design process, said process steps comprising steps to:
   (a) obtain a description of the IC design in a hardware description language (HDL);
   (b) perform floor planning based on the HDL description;
   (c) insert buffers into the IC design based on said floor planning; and
   (d) estimate loads in the IC design while taking into account effects of the buffers,
      wherein the buffers are inserted in step (c) based on anticipated processing later in the IC design process.

20. An apparatus for performing load estimation prior to physical layout in an integrated circuit (IC) design process, said apparatus comprising:
   (a) means for obtaining a description of the IC design in a hardware description language (HDL);
   (b) means for performing floor planning based on the HDL description;
   (c) means for inserting buffers into the IC design based on said floor planning; and
   (d) means for estimating loads in the IC design while taking into account effects of the buffers,
      wherein the buffers are inserted in step (c) based on anticipated processing later in the IC design process.

* * * * *